United States Patent [19]
Tanaka et al.

[11] Patent Number: 5,511,030
[45] Date of Patent: Apr. 23, 1996

[54] SEMICONDUCTOR MEMORY DEVICE AND METHOD OF DRIVING SAME

[75] Inventors: Yasuhiro Tanaka; Tetsuya Tanabe; Satoru Tanoi, all of Tokyo, Japan

[73] Assignee: OKI Electric Industry Co., Ltd., Tokyo, Japan

[21] Appl. No.: 296,364

[22] Filed: Aug. 24, 1994

[30] Foreign Application Priority Data

Aug. 31, 1993 [JP] Japan ............................ 5-216028

[51] Int. Cl.$^6$ ........................................... G11C 7/00
[52] U.S. Cl. ............................. 365/203; 365/190
[58] Field of Search .................... 365/203, 190, 365/230.03, 233

[56] References Cited

U.S. PATENT DOCUMENTS

| | | | |
|---|---|---|---|
| 4,656,608 | 4/1987 | Aoyama | 365/190 |
| 4,813,022 | 3/1989 | Matsui | 365/190 |
| 5,315,555 | 5/1994 | Choi | 365/203 |

FOREIGN PATENT DOCUMENTS

| | | |
|---|---|---|
| 260503 | 3/1988 | European Pat. Off. . |
| 323172 | 7/1989 | European Pat. Off. . |
| 5-16117 | 3/1993 | Japan . |

Primary Examiner—A. Zarabian
Attorney, Agent, or Firm—Steven M. Rabin

[57] ABSTRACT

A semiconductor memory device according to the present invention is constructed in such a manner that two first and second memory circuits are respectively electrically connected to one sense amplifier provided between the memory circuits through changeover elements and equalize elements are electrically connected to their corresponding bit line pairs included in the memory circuits. Owing to this construction, an operation for resetting the bit line pair in the first memory circuit and the sense amplifier after completion of access to the first memory circuit and an operation for reading data into the bit line pair in the second memory circuit can be performed so as to overlap each other in time. It is therefore possible to obtain quick-access to the second memory circuit.

16 Claims, 5 Drawing Sheets

SEMICONDUCTOR MEMORY DEVICE AND METHOD OF DRIVING SAME

CROSS-REFERENCE TO RELATED APPLICATION

This application claims the priority benefits of Japanese application No. 5- 216028, filed Aug. 31, 1993, the entire disclosure of which is incorporated herein by reference.

BACKGROUND OF THE INVENTION

This invention relates to a semiconductor memory device and a method of driving the semiconductor memory device, and particularly to a semiconductor memory device having sense amplifiers and a method of driving the semiconductor memory device.

A semiconductor memory device such as a Dynamic Random Access Memory (hereinafter called "DRAM") has sense amplifiers each indispensable for amplifying a small electric charge stored in a memory cell and reading the amplified electric charge.

This type of DRAM device has been disclosed in Japanese Patent Application Publication No. 5-16117 laid open to public inspection on Mar. 3, 1993.

SUMMARY OF THE INVENTION

It is an object of the present invention to provide a DRAM device capable of shortening the time for reading data from a memory and writing it therein as compared with a conventional DRAM device.

In order to achieve the above object, the present invention provides a semiconductor memory device comprising:

a first memory circuit including a first word line, a first bit line pair intersecting the first word line and a memory cell connected to a point where the first word line and the first bit line pair intersect;

a second memory circuit including a second word line, a second bit line pair intersecting the second word line and a memory cell connected to a point where the second word line and the second bit line pair intersect;

a sense, amplifier having a node pair provided so as to correspond to the first and second bit line pairs and means for amplifying a difference in potential across the node pair;

a reset circuit for resetting the potential difference to zero potential;

a first changeover element for connecting the first bit line pair and the node pair to one another;

a second changeover element for connecting the second bit line pair and the node pair to one another;

a first equalization element connected to the first bit line pair, for setting the first bit line pair to the same potential; and a second equalization element connected to the second bit line pair, for setting the second bit line pair to the same potential.

Further, the present application discloses other various inventions made to achieve the above object. These inventions will be understood from the appended claims, the following embodiments and the accompanying drawings.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

DETAILED DESCRIPTION OF THE PREFERRED EMBODIMENTS

Figure 1:
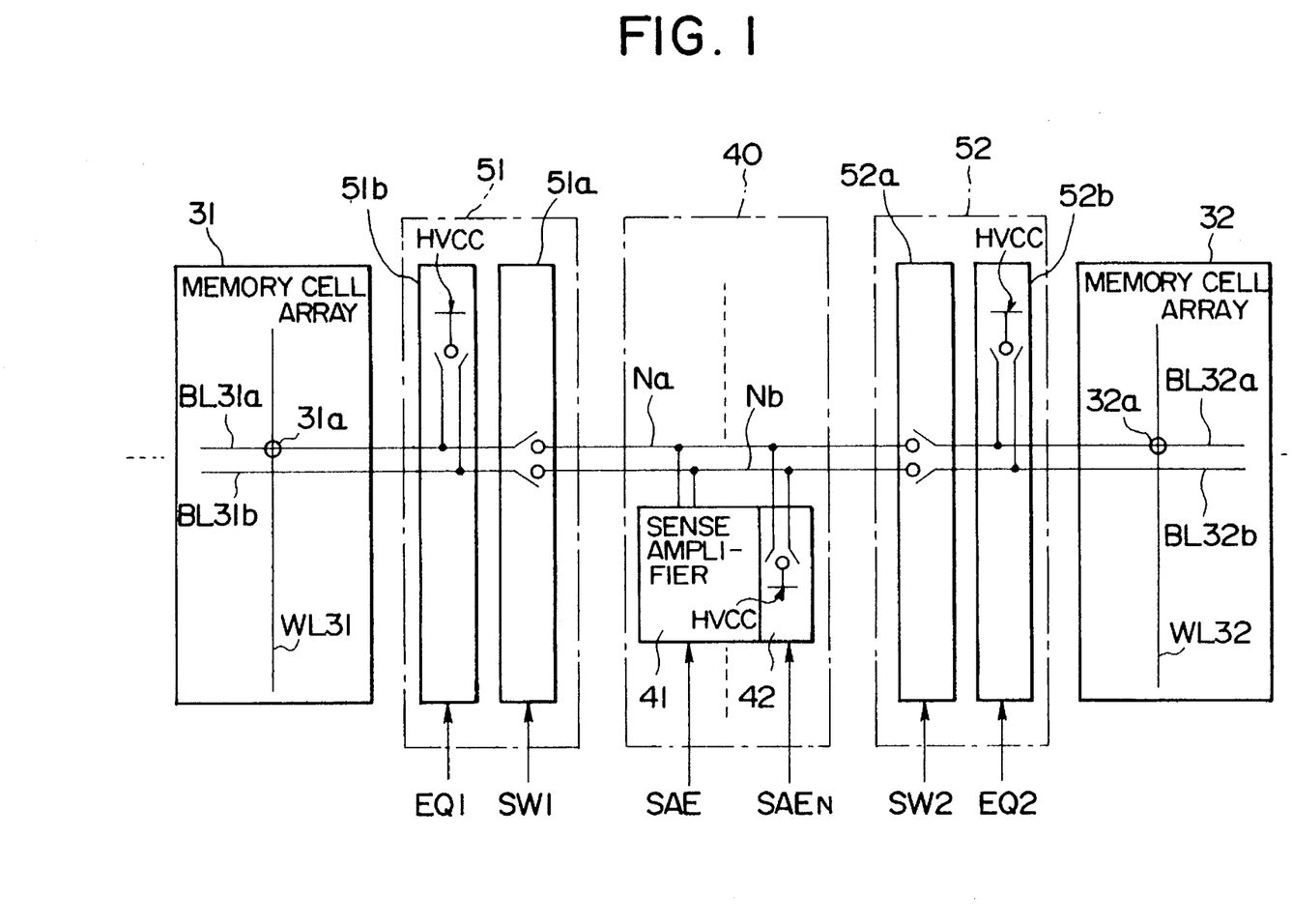
FIG. 1 is a view for describing a first embodiment of the present invention.

FIG. 1 is a fragmentary view of a DRAM which is one semiconductor memory device showing a first embodiment of the present invention.

The DRAM has a plurality of memory cell arrays. The memory cell arrays are designated by numerals 31 and 32 in the drawing.

The memory cell array 31 has a plurality of word lines and a plurality of complementary bit line pairs disposed so as to intersect their corresponding word lines. A plurality of information storage memory cells are respectively electrically connected to points where the word lines and the complementary bit line pairs intersect, and are arranged in matrix form. Respective ones of these, i.e., a word line WL31, a bit line pair BL31a/BL31b and a memory cell 31a are shown in FIG. 1.

The memory cell 31a comprises one transistor type memory cell composed of a MOS transistor and a MOS capacitor used for transmission, for example. In the memory cell array 31, the writing of information into the memory cell 31a or reading of it therefrom can be performed by selecting a word line based on a row address and selecting a bit line pair based on a column address.

The memory cell array 32 is constructed in a manner similar to the memory cell array 31. Respective ones of a plurality of word lines, a plurality of complementary bit line pairs and a plurality of information storage memory cells are provided, e.g., a word line WL32, a bit line pair BL32a/BL32b, and a memory cell 32a as shown in FIG. 1.

A sense amplifier array 40 is provided between the memory cell arrays 31 and 32. The sense amplifier array 40 comprises a plurality of sense amplifiers (one of which is designated by reference numeral 41 in FIG. --1) each activated by an activation signal SAE. The array 40 also includes a plurality of sense amplifier reset elements (one of which is designated by reference numeral 42 in FIG. 1), each electrically connected to terminals Na and Nb for detecting and amplifying the activation signal SAE and each activated by an inversion activation signal $SAE_N$. The sense amplifier 41 has a function to detect and amplify a difference in potential between the lines of the bit line pair, which is developed by an electric charge stored in the memory cell. Further, the sense amplifier 41 is comprised of flip-flops and the like. The sense amplifier 41 is required where one transistor type memory cell having a signal level corresponding to several tens of millivolts to several hundreds of millivolts, for example, is applied to the memory cell 31a. The sense amplifier reset element 42 is activated by the inversion activation signal $SAE_N$ and has a function to reset each of the potentials at the terminals Na and Nb to an intermediate potential HVCC.

A first switch means 51 for electrically connecting the sense amplifier array 40 and the memory cell array 31 to one another is provided between them. Similarly, a second switch means 52 for electrically connecting the sense amplifier array 40 and the memory cell array 32 is provided between them. The first switch means 51 comprises a first changeover element 51a composed of a transfer gate and the like, for electrically connecting the bit line pair BL31a/BL31b of the memory cell array 31 and the sense amplifier 41 to each other in response to an activation signal SW1, and a first bit line pair equalization element 51b. The first bit line pair equalization element 51b has a function to maintain the bit line pair BL31a/BL31b at the intermediate potential HVCC based on an activation signal EQ1 upon pre-charging the memory cell array 31 while the latter is inactive. Likewise, the second switch means 52 comprises a second changeover element 52a composed of a transfer gate and the like, for electrically connecting the bit line pair BL32a/BL32b of the memory cell array 32 and the sense amplifier 41 to each other in response to an activation signal SW2, and a second bit line pair equalization element 52b for maintaining the bit line pair BL32a/BL32b at the intermediate potential HVCC based on an activation signal EQ2 upon pre-charging the memory cell array 32 while the latter is inactive. The bit line pair BL31a/BL31b of the memory cell array 31 and the bit line pair BL32a/BL32b of the memory cell array 32 are respectively electrically connected to the single (common) sense amplifier 41 through the first and second switch means 51 and 52.

Figure 2:
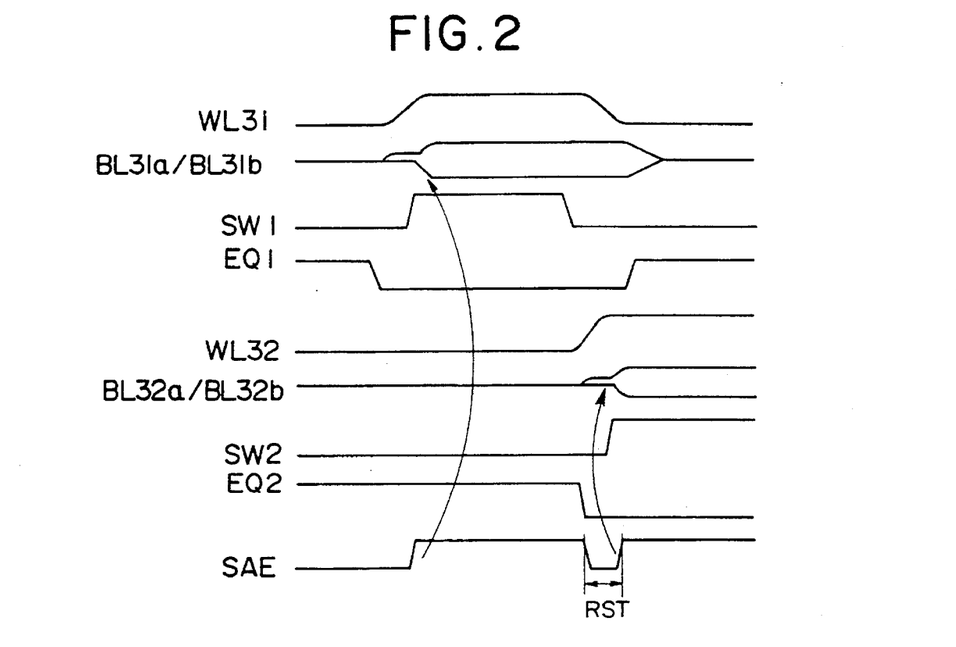
FIG. 2 is a timing chart for describing the operation of the DRAM shown in FIG. 1.

FIG. 2 is a timing chart for illustrating the operation of obtaining access to the memory cell array 32 after completion of access to the memory cell array 31 (i.e., the memory cell array 31 Æ the memory cell array 32).

When the memory cell array 31 is accessed, for example, the first bit line pair equalization element 51b in the first switch means 51 is deactivated in response to a word line selection operation executed based on the row address while the activation signal EQ1 is "L (Low)" in level. Immediately after the activation signal EQ1 has been brought to the L level, the word line WL31 of the memory cell array 31 is driven so as to go "H (High)" in level. When the word line WL31 goes "H", the information stored in the memory cell 31a is read into the bit line pair BL31a/BL31b. Thereafter, the activation signal SW1 is brought to an "H" level to turn ON the first changeover element 51a provided within the first switch means 51, thereby connecting the bit line pair BL31a/BL31b and the sense amplifier 41 in the sense amplifier array 40 to one another. The activation signal SAE is brought to an "H" level simultaneously when the activation signal SW1 goes "H", so that the sense amplifier 41 in the sense amplifier array 40 is activated to detect and amplify a difference in potential between the bit two lines of the line pair BL31a and BL31b. Since, at this time, the inversion activation signal $SAE_N$ is "L" in level, the sense amplifier reset element 42 is in an inactive state.

Next, the information read and amplified by the sense amplifier 41 is output to an unillustrated outer data input-output circuit. Thereafter, the activation signal SW1 is brought to an "L" level, so that the first changeover element 51a in the first switch means 51 is turned OFF so as to electrically disconnect the sense amplifier array 40 from the bit line pair BL31a/BL31b. In order to prevent the information stored in the memory cell 31a from being destroyed, the word line WL31 of the memory cell array 31 is brought to a GND level. Thereafter, the activation signal EQ1 first goes "H" to drive the first bit line pair equalize element 51b, so that the voltage on each line of the bit line pair BL31a/BL31b is equalized to the intermediate potential HVCC. Immediately after the activation signal SW1 has been brought to the "L" level, the inversion activation signal $SAE_N$ is brought to an "H" level so as to activate the sense amplifier reset element 42 in the sense amplifier array 40. As a result, the terminals Na and Nb are reset to the intermediate potential HVCC. On the other hand, when the activation signal SW1 goes "L", the first changeover element 51a is turned OFF to electrically disconnect the sense amplifier array 40 from the bit line pair BL31a/BL31b. Immediately after that disconnection, the activation signal EQ2 is brought to an "L" level so that the second bit line pair equalize element 52b in the second switch means 52 is deactivated. Thereafter, the word line WL32 of the memory cell array 32 is driven so as to go "H", so that the information stored in the memory cell 32a is read onto the bit line pair BL32a/BL32b. When the activation signal SW2 is brought to an "H" level and the second changeover element 52a in the second switch means 52 is activated, the bit line pair BL32a/BL32b is electrically connected to the sense amplifier array 40. Simultaneously with this connection, the activation signal SAE is brought to the "H" level so that a difference in potential between the bit line pair BL32a and BL32b is amplified by the sense amplifier 41.

According to the operation shown in FIG. 2 as described above, an operation for lowering or deactivating the word line WL31 immediately after the turning off of the first changeover element 51a and equalizing the bit line pair BL31a/BL31b, and an operation for driving or activating the word line WL32 and reading the information stored in the memory cell onto the bit line pair BL32a/BL32b, can be performed so as to overlap each other in time. It is thus unnecessary to increase an area occupied by the DRAM as a whole. Further, a memory operating time can be shortened so that the DRAM can be operated at a high speed.

Figure 3:
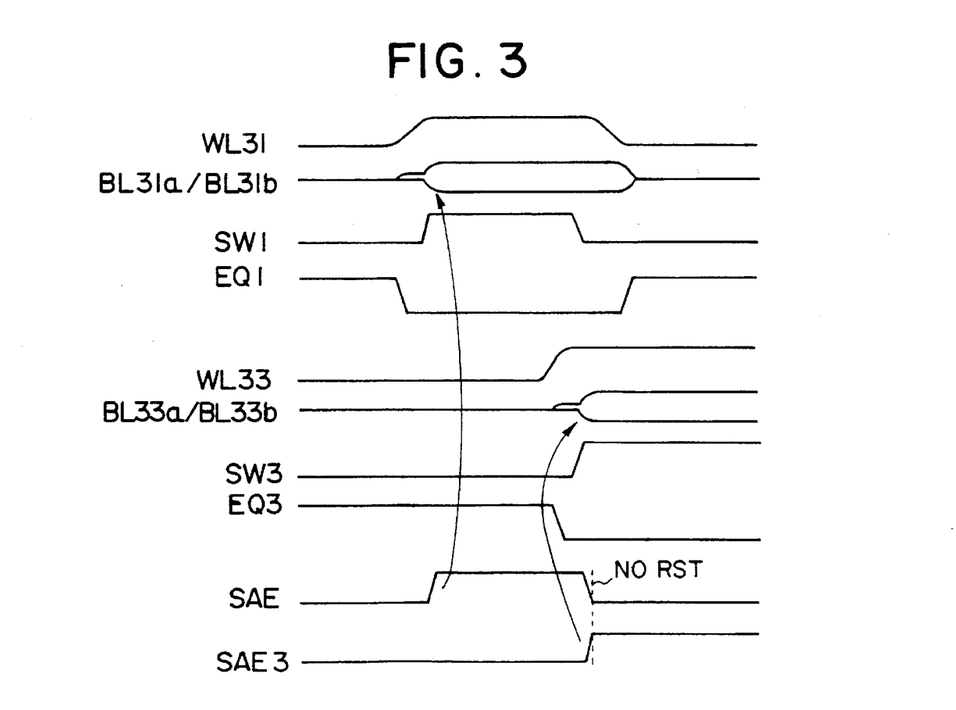
FIG. 3 is a timing chart for describing another operation of the DRAM shown in FIG. 1.

FIG. 3 is a timing chart for describing the operation for reading information stored in a memory cell of an unillustrated other memory cell array 33 which does not share the memory cell array 31 and the sense amplifier array 40, after the information stored in the memory cell 31a in the memory cell array 31 shown in FIG. 1 has been read (i.e., the memory cell array 31 Æ the memory cell array 33).

When the memory cell array 31 is accessed, for example, the activation signal EQ1 is brought to the "L" level in response to the word line selection operation executed based on the row address so that the first bit line pair equalization element 51b in the first switch means 51 is deactivated. Thus, the word line WL31 of the memory cell array 31 is driven so as to go "H (High)" in level. When the word line WL31 goes "H", the information stored in the memory cell 31a is read onto the bit line pair BL31a/BL31b. Thereafter, the activation signal SW1 is brought to the "H" level to turn ON the first changeover element 51a provided within the first switch means 51, thereby connecting the bit line pair BL31a/BL31b and the sense amplifier 41 in the sense amplifier array 40 to one another. When the activation signal SAE is brought to the "H" level simultaneously when the first changeover element 51a is brought into an ON condition, the sense amplifier 41 in the sense amplifier array 40 is activated to detect and amplify a difference in potential between the two lines of the bit line pair BL31a and BL31b.

The information read from the memory cell 31a, which has been amplified by the sense amplifier 41, is output from an unillustrated outer data input-output circuit. Thereafter, the activation signal SW1 is brought to the "L" level so that the first changeover element 51a in the first switch means 51 is turned OFF so as to electrically disconnect the sense amplifier 41 from the bit line pair BL31a/BL31b. In order to prevent the information stored in the memory cell 31a from being destroyed, the word line WL31 of the memory cell array 31 is brought to the GND level. Next, when the activation signal EQ1 is brought to the "H" level, the voltage on each the bit line pair BL31a/BL31b is equalized to the intermediate potential HVCC by the first bit line pair equalization element 51b in the first switch means 51. Simultaneously, the inversion activation signal $SAE_N$ is brought to the "H" level so as to activate the sense amplifier reset element 42 in the sense amplifier array 40. As a result, the terminals Na and Nb are reset to the intermediate potential HVCC.

Since the unillustrated other memory cell array 33 does not share the memory cell array 31 and the sense amplifier array 40, the word line WL33 in the memory cell array 33 is driven to the "H" level and the subsequent memory operation can be performed so as to overlap with the operation for resetting the memory cell array 31, regardless of the timing at which the sense amplifier 41 and the bit line pair BL31a/BL31b are electrically disconnected from each other by the first changeover element 51a in the first switch means 51.

Thus, when the unillustrated other memory cell array 33 that does not share the memory cell array 31 and the sense amplifier array 40, is accessed after the memory cell array 31 has been accessed, a sense amplifier array 40 different from the above sense amplifier array 40 is activated. It is thus unnecessary for the activation of the memory cell array 33 to wait for the timing for resetting the terminals Na and Nb of the sense amplifier 41, which have been electrically connected to the memory cell array 31. Accordingly, the time required to cause the operation for lowering or deactivating the word line WL31 and equalizing the bit line pair BL31a/BL31b and the operation for driving or activating the word line WL33 and reading information stored in a memory cell onto a bit line pair BL33a/BL33b to overlap each other can be made longer.

Second embodiment

Figure 4:
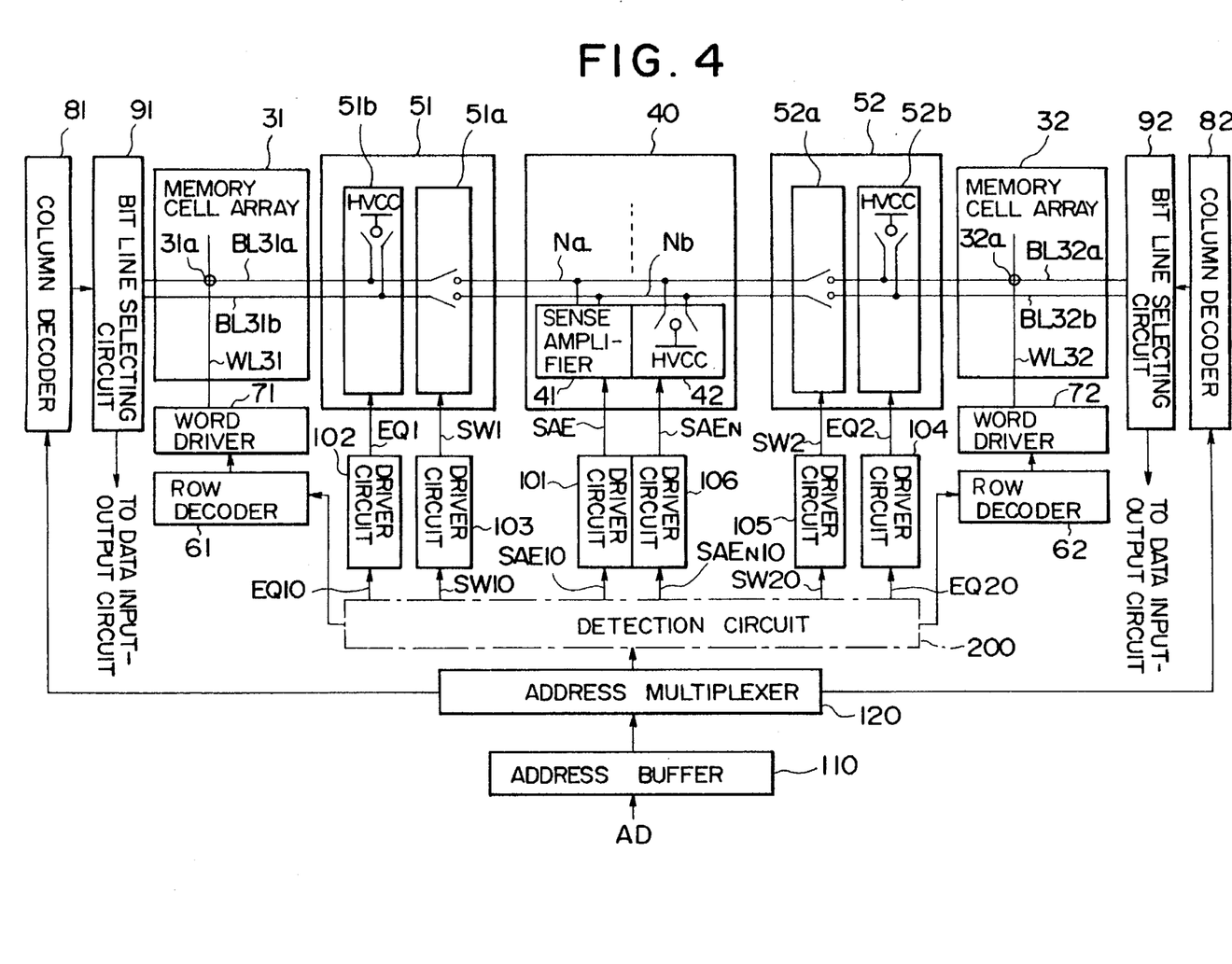
FIG. 4 is a view for describing a second embodiment of the present invention.

FIG. 4 is a view schematically showing the structure of a DRAM which is of a semiconductor memory device according to a second embodiment of the present invention. Elements of structure, which are common to those shown in the first embodiment, are identified by common reference numerals.

In the DRAM, first and second row decoders 61 and 62 for respectively decoding row addresses so as to select word lines WL31 and WL32, and first and second word drivers 71 and 72 for respectively driving the word lines WL31 and WL32 in response to the outputs of the row decoders 61 and 62, are electrically connected to their corresponding first and second memory cell arrays 31 and 32. Further, first and second column decoders 81 and 82 for respectively decoding column addresses so as to select bit line pairs BL31a/BL31b and BL32a/BL32b and first and second bit line pair selecting circuits 91 and 92 respectively activated by the first and second column decoders 81 and 82, for respectively outputting memory cell information amplified by a sense amplifier array 40 to unillustrated data input-output circuits and outputting write information supplied from the data input-output circuits to the bit line pairs BL31a/BL31b and BL32a/BL32b, are electrically connected to the first and second memory cell arrays 31 and 32.

Drive circuits 101, 102, 103, 104, 105 and 106 are respectively electrically connected to a sense amplifier 41 provided within the sense amplifier array 40, a bit line pair equalize element 51b provided within a switch means 51, a changeover element 51a provided within the switch means 51, a bit line pair equalize element 52b provided within a switch means 52, a changeover element 52a provided within the switch means 52, and a sense amplifier reset element 42 provided within the sense amplifier array 40. The drive circuits 101 through 106 are respectively comprised of two-stage inverters, for example. Further, the drive circuits 101 through 106 have functions to output activation signals SAE, EQ1, SW1, EQ2, SW2 and $SAE_N$, respectively.

Further, the DRAM according to the present embodiment is provided with an address buffer 110 supplied with outer addresses AD. A detection circuit 200 is electrically connected to the address buffer 110 through an address multiplexer 120. The address multiplexer 120 serves as a circuit for taking in a row address and a column address from the address buffer 110 through the same external terminal with a timing shift held therebetween. The address multiplexer 120 has a structure having an inner latch circuit. When the row address of the outer addresses AD is latched in the inner latch circuit through the address buffer 110, it is unnecessary to input the row address from the outside. It is also unnecessary to input the column address upon starting a memory operation. Therefore, the number of external terminals can be reduced to half owing to the provision of the address multiplexer 120. After the row address has been latched in the inner latch circuit in the address multiplexer 120, the address multiplexer 120 outputs signals for activating the first and second column decoders 81 an 82 used to drive the first and second bit line pair selecting circuits 91 and 92 respectively.

The detection circuit 200 has a function for receiving the output of the address multiplexer 120, which is produced based on the row address and detecting that the other memory cell array 32 (or 31) has been selected subsequently to the selection of the memory cell array 31 (or 32), and a function for controlling the first row decoder 61 and the first word driver 71 used to activate the selected memory cell array 31 or the second row decoder 62 and the second word driver 72 used to activate the selected memory cell array 32 and outputting control signals SAE10, EQ10, SW10, EQ20, SW20, $SAE_N10$ to their corresponding drive circuits 101 through 106 to independently control the drive circuits 101 through 106.

Figure 5:
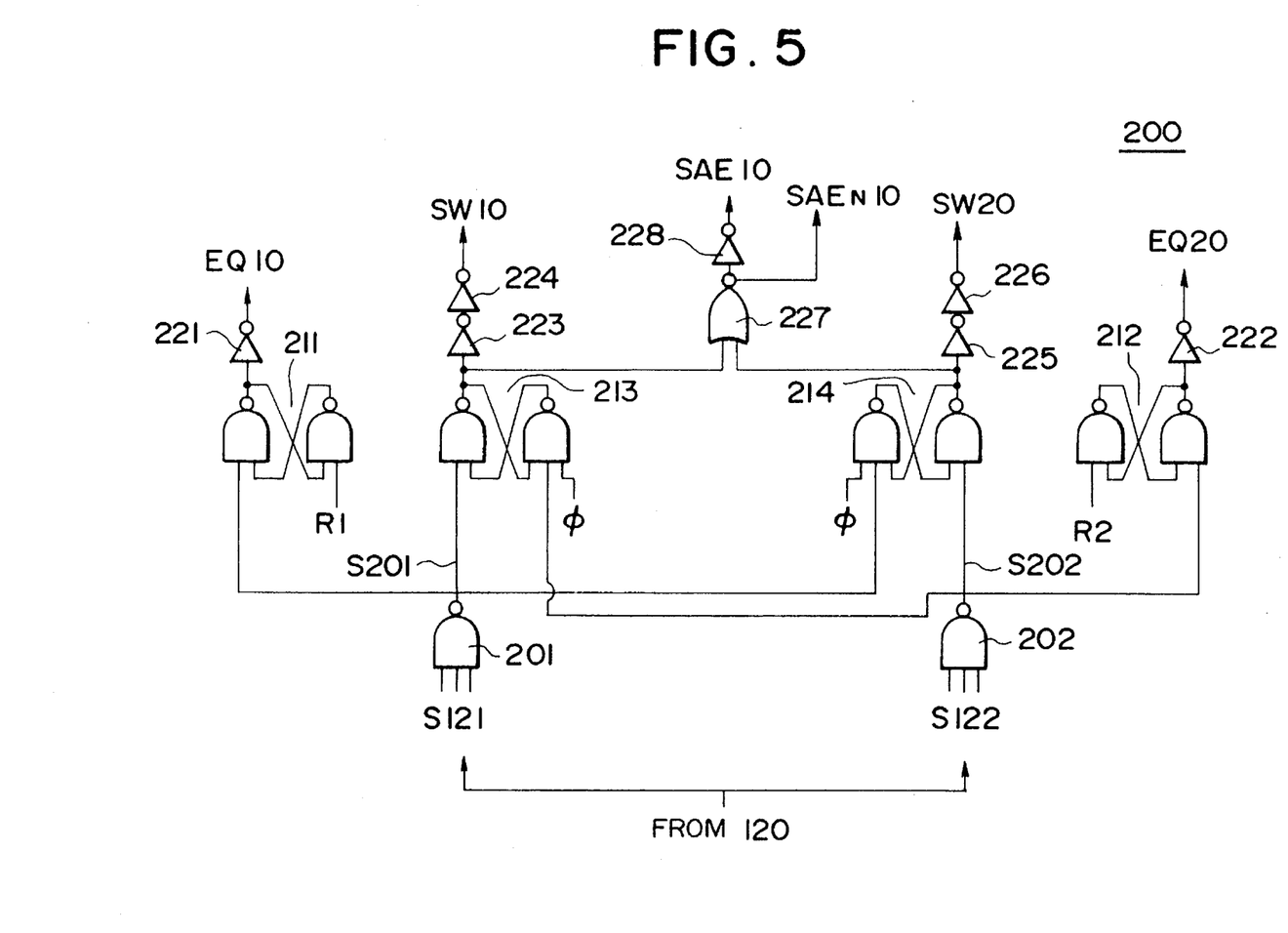
FIG. 5 is a circuit diagram showing a means for detecting the state of selection of a memory cell array, which is shown in FIG. 4.

FIG. 5 is a circuit diagram of the detection circuit 200 shown in FIG. 4.

The detection circuit 200 has two NAND gates 201 and 202 for respectively decoding a select signal S121 supplied from the address multiplexer 120, for selecting the memory cell array 31 and a select signal S122 supplied from the address multiplexer 120, for selecting the memory cell array 32. Flip-flops (hereinafter called "FFs") 211, 213 and 214 are electrically connected to the output of the NAND gate 201, whereas an FF 212 and the FFs 213 and 214 are electrically connected to the output of the NAND gate 202. Each of the FFs 211 through 214 comprises two NAND gates which have been cross-connected to each other.

The FF 211 of these FFs serves as a circuit for bringing the output thereof to an "H" level when a signal S201 output from the NAND gate 201 falls into an "L" level and bringing the output thereof to an "L" level when an activation signal R1 for activating the first row decoder 61 falls to an "L" level. The FF 212 serves as a circuit for bringing the output thereof to an "H" level when a signal S202 output from the NAND gate 202 falls to an "L" level and bringing the output thereof to an "L" level when an activation signal R2 for activating the second row decoder 62 is reduced to an "L" level. The activation signals R1 and R2 are respectively used as signals for driving word lines which act slowly, and indicate that the memory cell arrays 31 and 32 are electrically disconnected from the sense amplifier array 40 and bit lines are equalized after the word lines have been brought to a GND level.

The FF 213 serves as a circuit for bringing the output thereof to an "H" level when the output signal S201 of the NAND gate 201 falls to the "L" level and bringing the output thereof to the "L" level when a clock signal φ falls to an "L" level. The FF 214 serves as a circuit for bringing the output thereof to an "H" level when the output signal S202 of the NAND gate 202 falls to the "L" level and bringing the output thereof to an "L" level when the clock signal φ falls to the "L" level. The clock signal φ is used as a signal for resetting the control signals SW10 and SW20.

An inverter 221 for outputting the control signal EQ10 therefrom is electrically connected to the output of the FF 211. An inverter 222 for outputting the control signal EQ20 therefrom is electrically connected to the output of the FF 212. Two-stage inverters 223 and 224 for outputting the control signal SW10 are electrically connected to the output of the FF 213. Two-stage inverters 225 and 226 for outputting the control signal SW20 are electrically connected to the output of the FF 214. Further, the outputs of the FFs 213 and 214 are electrically connected to a two-input NOR gate 227 from which the control signal SAE$_N$10 is output and inverted by an inverter 228 so as to be output as the control signal SAE 10.

Figure 6:
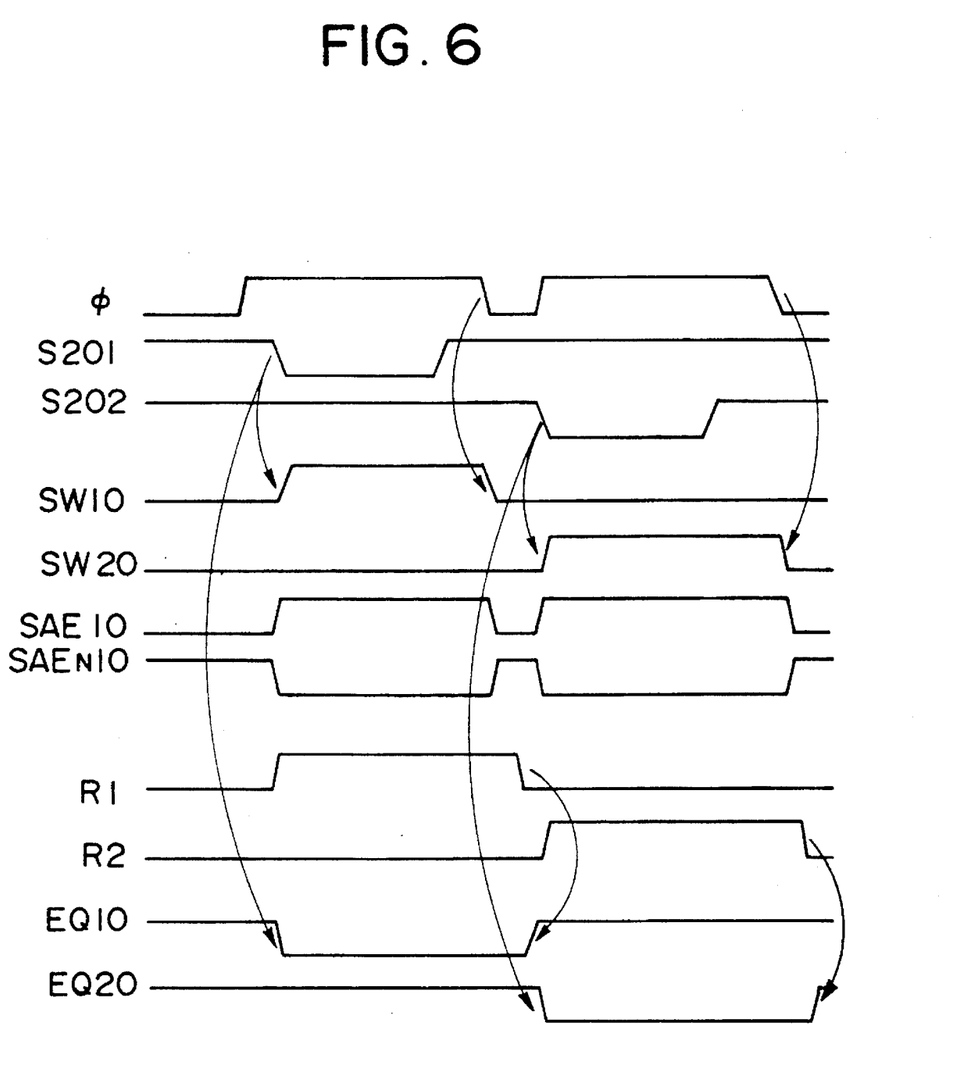
FIG. 6 is a timing chart for describing the operation of the means shown in FIG. 5.

FIG. 6 is a timing chart for describing the operation of the detection circuit 200. The operations of the DRAM shown in FIG. 4 and the detection circuit 200 will be described below with reference to FIG. 6.

When the outer addresses AD are input to the address buffer 110 shown in FIG. 4, the output of the address buffer 110 is sent to the address multiplexer 120. The address multiplexer 120 takes in the row address and the column address corresponding to the output of the address buffer 110 with a timing shift held therebetween. Thereafter, the address multiplexer 120 sends the column address to each of the first and second column decoders 81 and 82 and transmits the row address or the like to the detection circuit 200. The detection circuit 200 receives the select signals S121 and S122 for respectively selecting the memory cell arrays 31 and 32, which are output from the address multiplexer 120 based on the row address. The memory cell array 31 is selected based on the one select signal S121 and the memory cell array 32 is selected based on the other select signal S122.

When the memory cell array 31 is selected, for example, the control signal EQ10, the control signal SW10, the control signal SAE 10, the control signal SAE$_N$10 and the control signal SW20 are respectively output from the inverter 221, the inverter 224, the inverter 228, the NOR gate 227 and the inverter 226 in the detection circuit 200 shown in FIG. 5 and sent to their corresponding drive circuits 102, 103, 101, 106 and 105. As a result, the drive circuits 102, 103, 101, 106 and 105 are respectively driven in response to the control signals EQ10, SW10, SAE 10, SAE$_N$10 and SW20 so as to output the activation signals EQ1 and SW1, SAE and SAE$_N$, and SW2 and EQ2 to the switch means 51, the sense amplifier array 40 and the switch means 52 respectively.

In the memory cell array 31 shown in FIG. 4, the word line WL31 selected by the first row decoder 61 and the first word driver 71 is driven so that the information stored in the memory cell 31a connected to the word line WL31 is read into the bit line pair BL31a/BL31b. A difference in potential between the two lines of the bit line pair BL31a and BL31b is detected and amplified by the sense amplifier array 40 through the switch means 51 in a manner similar to the first embodiment. Next, the first column decoder 81 is activated in response to the output of the address multiplexer 120, so that the first bit line pair selecting circuit 91 is operated in response to the output of the first column decoder 81 to output the memory cell information on the bit line pair BL31a/BL31b to the unillustrated outer data input-output circuit.

When the select signal S122 for selecting the memory cell array 32 is next output from the address multiplexer 120, the control signal SW10, the control signal SAE10, the control signal SAE$_N$10, the control signal SW20 and the control signal EQ20 are respectively output from the inverter 224, the inverter 228, the NOR gate 227, the inverter 226 and the inverter 222 in the detection circuit 200 shown in FIG. 5 and sent to the drive circuits 103, 101, 106, 105 and 104 shown in FIG. 4. Thus, the activation signals SW1, SAE, SAE$_N$, SW2 and EQ2 are respectively output from the drive circuits 103, 101, 106, 105 and 104 shown in FIG. 4 and transmitted to the switch means 51, the sense amplifier array 40 and the switch means 52. As a result, the access to the memory cell array 32 is performed in a manner similar to the first embodiment.

The present embodiment has the following advantages.

The detection circuit 200 shown in FIG. 4 receives the select signal S121 for selecting the memory cell array 31 based on the row address supplied from the address multiplexer 120 or the select signal S122 for selecting the memory cell array 32 based on the row address and independently controls the drive circuits 101 through 106. The switch means 51 and 52 and the sense amplifier array 40 are operated in response to the activation signals output from the drive circuits 101 through 106. Therefore, the operation for resetting the operation of writing the information into and reading it from the memory cell array 31 (or 32) and the operation for resetting the operation of writing information into and reading it from the memory cell array 32 (or 31) activated in the next place can be performed so as to overlap each other in time in a manner similar to the first embodiment. It is thus unnecessary to increase the area occupied by the semiconductor memory device serving as the entire DRAM. Further, the memory operating time can be shortened, so that the semiconductor memory device can be operated at a high speed.

Incidentally, the present invention is not necessarily limited to or by the above embodiments. It is apparent that various modifications can be made. The detection circuit 200 shown in FIG. 4 may be comprised of a circuit other than that shown in FIG. 5, for example. Alternatively, other circuit elements may be added to the DRAMs shown in FIGS. 1 and 4. Further, the present invention is not limited to or by the DRAMs according to the above embodiments and can be applied to other semiconductor memory device.

What is claimed is:

1. A semiconductor memory device comprising:
   a first memory circuit including a first word line, a first bit line pair intersecting said first word line and a memory cell connected to a point where said first word line and said first bit line pair intersect;

a second memory circuit including a second word line, a second bit line pair intersecting said second word line and a memory cell connected to a point where said second word line and said second bit line pair intersect;

a sense amplifier having a pair of nodes provided so as to correspond to said first bit line pair and to said second bit line pair and means for amplifying a differential voltage between said pair of nodes;

a reset circuit for resetting the voltages on the two nodes of said pair of nodes to a predetermined voltage;

a first changeover element for connecting said first bit line pair and said pair of nodes to one another;

a second changeover element for connecting said second bit line pair and said pair of nodes to one another;

a first equalization element connected to said first bit line pair, for setting said first bit line pair to a first equalization potential;

a second equalization element connected to said second bit line pair, for setting said second bit line pair to a second equalization potential;

a first drive circuit for turning off said first changeover element after an access to said memory cell in said first memory circuit;

a second drive circuit for activating said first equalization element after a deactivation of said first word line following the turning off of said first changeover element;

a third drive circuit for causing a first operation for deactivating said first word line and a second operation overlapping the first operation in time, for activating said first equalization element after the turning off of said first changeover element, and for activating said reset circuit for resetting the voltages on the two nodes of said pair of nodes to the predetermined voltage;

a fourth drive circuit for activating said second equalization element for setting said second bit line pair to the second equalization potential to enable information stored in said second memory circuit to be transferred to said second bit line pair;

a fifth drive circuit for driving said second changeover element to transfer information stored in said memory cell in said second memory circuit to said pair of nodes after said pair of nodes has been reset;

a sixth drive circuit for driving said sense amplifier to amplify the differential voltage between the two nodes of said pair of nodes; and detecting means for detecting that said second memory circuit has been selected after the selection of said first memory circuit, and adapted to independently control said first, second, third, fourth, fifth and sixth drive circuits.

2. A semiconductor memory device according to claim 1, wherein said first memory circuit includes a first group of a plurality of word lines, a first group of a plurality of bit line pairs which respectively intersect said first group of the plurality of word lines, and a first group of a plurality of memory cells respectively connected to points where said first group of the plurality of word lines and said first group of the plurality of bit line pairs intersect, and second memory circuit includes a second group of a plurality of word lines, a second group of a plurality of bit line pairs which respectively intersect said second group of the plurality of word lines, and a second group of a plurality of memory cells respectively connected to points where said second group of the plurality of word lines and said second group of the plurality of bit line pairs intersect.

3. A semiconductor memory device according to claim 2, further including an address multiplexer for outputting select signals for selecting said first and second memory circuits to said detecting means, said address multiplexer having a function for latching a row address and an input terminal for taking in said row address and a column address therethrough.

4. A semiconductor memory device according to claim 3, further including first and second column decoders for respectively receiving therein column addresses output from said address multiplexer and respectively selecting predetermined word lines from said first and second groups of the plurality of word lines, and first and second row decoders for respectively receiving therein row addresses output from said detecting means and respectively selecting predetermined bit line pairs from said first and second groups of the plurality of bit line pairs.

5. A semiconductor memory device according to claim 1, wherein the first and second equalization potentials are each equal to the predetermined voltage.

6. A semiconductor memory device comprising:

a first memory circuit including a first word line and a first pair of bit lines;

a second memory circuit including a second word line and a second pair of bit lines;

a sense amplifier having a pair of nodes provided so as to correspond to the first and second pairs of bit lines and means for amplifying a differential voltage between the pair of nodes;

a reset circuit for resetting the pair of nodes to a predetermined voltage;

a first switching circuit for connecting the first pair of bit lines and the pair of nodes to each other;

a second switching circuit for connecting the second pair of bit lines and the pair of nodes to each other;

a first equalization circuit coupled to the first pair of bit lines for setting both of the first pair of bit lines to a first equalization potential;

a second equalization circuit coupled to the second pair of bit lines for setting both of the second pair of bit lines to a second equalization potential; and a detecting circuit, coupled to said first and second memory circuits, said sense amplifier, said reset circuit, said first and second switching circuits and said first and second equalization circuits, for activating said first memory circuit, said sense amplifier, said first switching circuit and said second equalization circuit while deactivating said second memory circuit, said reset circuit, said second switching circuit and said first equalization circuit during a first period of time, and for activating said second memory circuit, said sense amplifier, said second switching circuit and said first equalization circuit while deactivating said first memory circuit, said reset circuit, said first switching circuit and said second equalization circuit during a second period of time which is nonoverlapping with respect to the first period of time.

7. A semiconductor memory device according to claim 6, wherein said detecting circuit activates said reset circuit while deactivating said first and second memory circuits, said sense amplifier, said first and second switching circuits and said first and second equalization circuits.

8. A semiconductor memory device according to claim 6, wherein said detecting circuit outputs a first activation signal to said first memory circuit for activating the first memory circuit and outputs a second activation signal to said second memory circuit for activating the second memory circuit.

9. A semiconductor memory device according to claim 8, wherein said detecting circuit outputs a sense amplifier activating signal to said sense amplifier, a first switching circuit activating signal to said first switching circuit and a second equalization circuit activating signal to said second equalization circuit, in response to the first activation signal.

10. A semiconductor memory device according to claim 8, wherein said detecting circuit outputs a sense amplifier activating signal to said sense amplifier, a second switching circuit activating signal to said second switching circuit and a first equalization circuit activating signal to said first equalization circuit, in response to the second activation signal.

11. A semiconductor memory device according to claim 6, wherein the first and second equalization potentials are equal to the predetermined voltage.

12. A semiconductor memory device according to claim 6, further comprising means for deactivating the first word line and activating the first equalization circuit during respective time durations that overlap each other.

13. A semiconductor memory device comprising:

a first memory circuit including a first word line and a first pair of bit lines, said first memory circuit being activated during a first period of time;

a second memory circuit including a second word line and a second pair of bit lines, said second memory circuit being activated in a second period of time which is nonoverlapping with respect to the first period of time;

a sense amplifier having a pair of nodes corresponding to the first pair of bit lines and further corresponding to the second pair of bit lines, and having means for amplifying a differential voltage between the pair of nodes, said sense amplifier being activated during the first and second periods of time;

a reset circuit for resetting the pair of nodes to a predetermined voltage, said reset circuit being deactivated during the first and second periods of time;

a first switching circuit for connecting the first pair of bit lines to the pair of nodes, said first switching circuit being activated during the first period of time;

a second switching circuit for connecting the second pair of bit lines to the pair of nodes, said second switching circuit being activated during the second period of time;

a first equalization circuit coupled to the first pair of bit lines for setting both of the first pair of bit lines to a first equalization potential, said first equalization circuit being activated during the second period of time; and a second equalization circuit coupled to the second pair of bit lines for setting both of the second pair of bit lines to a second equalization potential, said second equalization circuit being activated during the first period of time.

14. A semiconductor memory device according to claim 13, wherein said reset circuit is activated during a third period of time which is nonoverlapping with respect to the first period of time and nonoverlapping with respect to the second period of time.

15. A semiconductor memory device according to claim 13, wherein the first and second equalization potentials are equal to the predetermined voltage.

16. A semiconductor memory device according to claim 13, further comprising means for deactivating the first word line and activating the first equalization circuit during respective time durations that overlap each other.

\* \* \* \* \*